US012597918B2

(12) United States Patent
Inomata et al.

(10) Patent No.: US 12,597,918 B2
(45) Date of Patent: Apr. 7, 2026

(54) SEMICONDUCTOR DEVICE AND METHOD FOR DRIVING THE SAME

(71) Applicant: RENESAS ELECTRONICS CORPORATION, Tokyo (JP)

(72) Inventors: Noboru Inomata, Tokyo (JP); Hideyuki Tajima, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 183 days.

(21) Appl. No.: 18/470,830

(22) Filed: Sep. 20, 2023

(65) Prior Publication Data

US 2024/0146293 A1 May 2, 2024

(30) Foreign Application Priority Data

Oct. 27, 2022 (JP) ................................. 2022-172456

(51) Int. Cl.
*H03K 17/081* (2006.01)

(52) U.S. Cl.
CPC .................. *H03K 17/08116* (2013.01); *H03K 2217/0027* (2013.01)

(58) Field of Classification Search
CPC ..... H03K 17/08116; H03K 2217/0027; H03K 17/691; H03K 19/018507; H03K 17/18
See application file for complete search history.

(56) References Cited

U.S. PATENT DOCUMENTS

| | | | |
|---|---|---|---|
| 10,027,313 B2 | 7/2018 | Nagase et al. | |
| 2013/0094253 A1* | 4/2013 | Yang .................... | H02M 1/4258 |
| | | | 363/21.15 |
| 2013/0233979 A1* | 9/2013 | Zhang ...................... | H04B 1/44 |
| | | | 246/28 R |
| 2014/0333241 A1* | 11/2014 | Zhao ....................... | H02P 27/08 |
| | | | 318/400.02 |
| 2023/0059110 A1* | 2/2023 | Narayanasamy ... | H02M 7/5387 |

FOREIGN PATENT DOCUMENTS

JP        2016-046723 A        4/2016

* cited by examiner

*Primary Examiner* — Hannah S Wang
(74) *Attorney, Agent, or Firm* — Rimon P.C.

(57) ABSTRACT

A semiconductor device that outputs a high-speed and large-current pulse is provided. The semiconductor device includes: a first N channel transistor having its gate receiving a second voltage as its input; a first resistance element having its second terminal connected to a drain of the first N channel transistor; a second resistance element having its first terminal connected to a source of the first N channel transistor; a second N channel transistor having its gate receiving a second voltage as its input; a third resistance element having its second terminal connected to a drain of the second N channel transistor; a fourth resistance element having its first terminal connected to a source of the second N channel transistor; and an isolator having its first terminal connected to the drain of the first N channel transistor and having its second terminal connected to the drain of the second N channel transistor.

12 Claims, 3 Drawing Sheets

SEMICONDUCTOR DEVICE AND METHOD FOR DRIVING THE SAME

CROSS-REFERENCE TO RELATED APPLICATION

The disclosure of Japanese Patent Application No. 2022-172456 filed on Oct. 27, 2022, including the specification, drawings and abstract is incorporated herein by reference in its entirety.

BACKGROUND

The present disclosure relates to a semiconductor device and a method for driving the same.

There is disclosed technique listed below.

[Patent Document 1] Japanese Unexamined Patent Application Publication No. 2016-46723

The Patent Document 1 describes a communication device for restoring a signal transmitted via a non-contact transmission path with high accuracy. The communication device described in the Patent Document 1 includes a transmitter circuit that converts an input signal into a pulse and a non-contact transmission path that includes a primary coil and a secondary coil and transmits the pulse from the transmitter circuit in a non-contact manner. The communication device includes a restoration circuit that restores the input signal on the basis of a reception signal corresponding to the pulse transmitted via the non-contact transmission path and an initialization unit that initializes an output of the non-contact transmission path. Further, the communication device includes an initialization control unit that outputs a control signal for controlling the initialization unit on the basis of the reception signal corresponding to the pulse received via the non-contact transmission path.

SUMMARY

The Patent Document 1 describes a transmitter circuit that is composed of a pulse generation circuit and converts an input signal into a high-speed and large-current pulse current and outputs the pulse current. If the circuit is applied to, for example, an IGBT (Insulated Gate Bipolar Transistor) driver, when a steep potential difference occurs between an input and an output of an isolator, a high-speed and large-current source-sink current flows through an output of the transmitter circuit via an inter-isolator capacitance.

However, if the transmitter circuit is driven at a high speed and with a large current as described above by a regulator circuit embedded in an IC (Integrated Circuit), a regulator having a significantly large internal capacity or having a significantly high speed is required. Accordingly, the transmitter circuit is difficult to be mounted. If power is supplied from an external power supply without using the embedded regulator, the following problems occur. An element area increases to increase a withstand voltage by changing a low withstand voltage MOS (metal oxide semiconductor) transistor into a high withstand voltage MOS transistor. A level shifter circuit that converts a signal of a low voltage signal into a signal of a high voltage signal is required, and therefore, a high-speed pulse current cannot be output. Further, a voltage range of an external power supply VCC is large, and therefore, a current increases when the VCC is large.

An object of the present disclosure is to provide a semiconductor device that outputs a high-speed and large-current pulse using an N channel MOS transistor (hereinafter merely referred to as an N channel transistor) into which a load resistance and a source resistance are inserted but not using an embedded regulator at an output stage.

Other problems and novel characteristics will be apparent from the description of the present specification and the accompanying drawings.

According to one embodiment, a semiconductor device is a transmitter circuit that outputs a high-speed and large-current pulse using an N channel MOS transistor into which a load resistance and a source resistance are inserted.

According to the one embodiment, power is supplied from an external power supply without using an embedded regulator at an output stage, and therefore, power consumption of the regulator can be reduced. According to the one embodiment, no level shifter circuit is required, and therefore, a high-speed operation can be achieved.

BRIEF DESCRIPTIONS OF THE DRAWINGS

DETAILED DESCRIPTION

Embodiment

Figure 1:
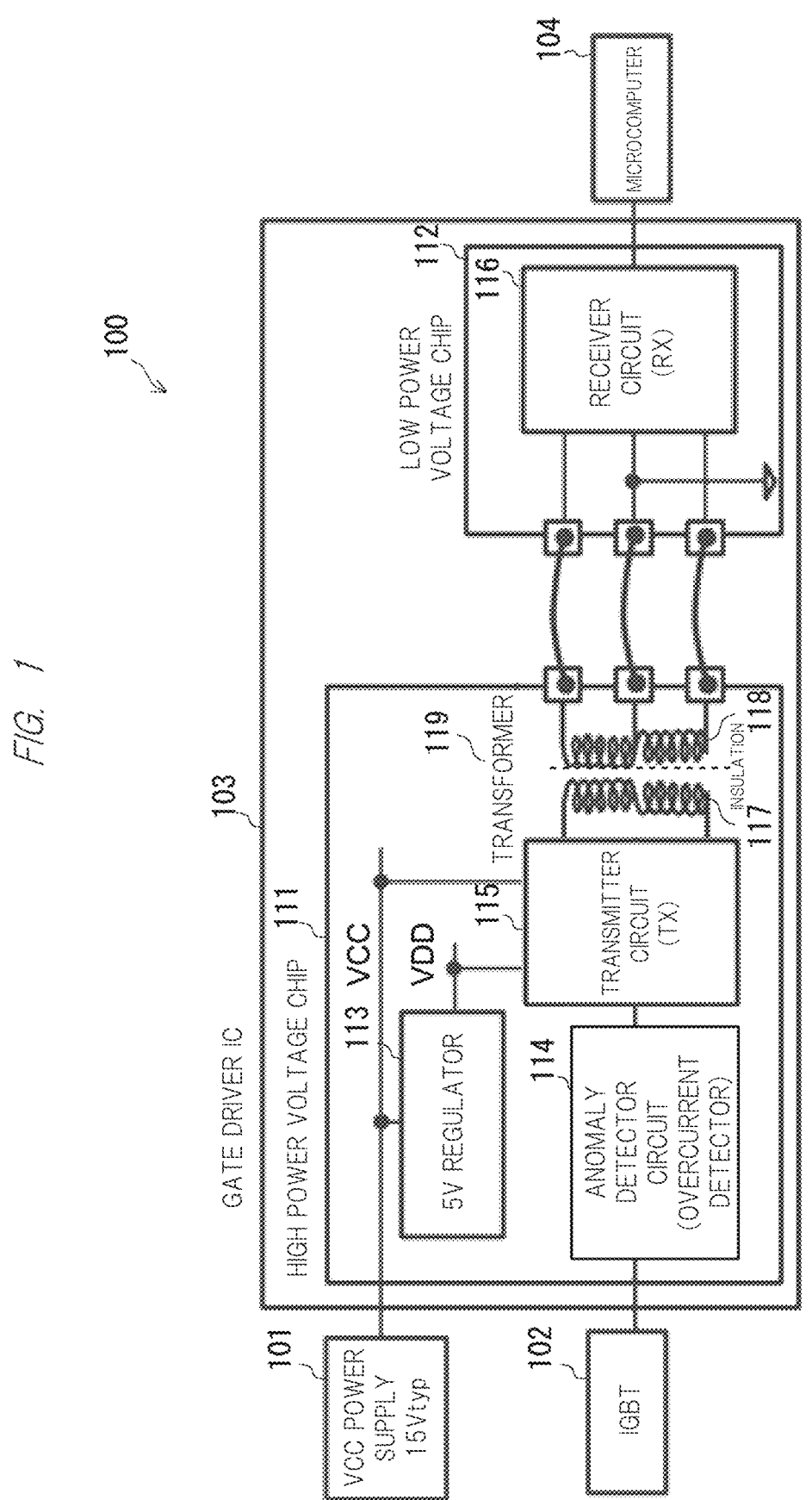
FIG. 1 is a block diagram illustrating a system to which respective semiconductor devices according to embodiments are applied.

For clarity of explanation, the following description and drawings are appropriately omitted and simplified. Each of elements described in the drawings, respectively, as functional blocks that perform various types of processing can be composed of a CPU, a memory, or another circuit in a hardware manner, and is achieved by a program or the like loaded into the memory in a software manner. Therefore, it would be understood by those skilled in the art that the functional blocks can be achieved in various forms by only hardware, only software, or their combination, and are not limited to any one of the forms. In the drawings, the same elements are respectively denoted by the same reference numerals, and description thereof is not repeated as needed.

Description of System to which Semiconductor Device According to Embodiment is Applied FIG. 1 is a block diagram illustrating a system to which respective semiconductor devices according to embodiments are applied. A system to which respective semiconductor devices according to first and second embodiments are applied will be described with reference to FIG. 1. A system 100 is applied to, for example, a circuit that transmits and receives a signal of an anomaly detector circuit in a gate driver of an IGBT.

The system 100 includes a VCC power supply 101, an IGBT 102, a gate driver IC 103, and a microcomputer 104. The gate driver IC includes a high power supply voltage chip 111 and a low power supply voltage chip 112. The high power supply voltage chip 111 includes a high power supply voltage line VCC, a 5V regulator 113, a lower power supply voltage line VDD, an anomaly detector circuit 114, a transmitter circuit (TX) 115, a first coil 117, a second coil 118, and a transformer 119 composed of an insulation capacitance. The low power supply voltage chip 112 includes a receiver circuit (RX) 116.

The VCC power supply 101 is a high voltage power supply. For example, a current having a voltage of 15 V is supplied to the gate driver IC. The IGBT 102 is a circuit composed of an insulated gate bipolar transistor. The gate driver IC 103 is a gate driver that drives the IGBT 102. The microcomputer 104 is, for example, a microcontroller or a microprocessor, i.e., a part of a computer that controls the IGBT 102 via the gate driver IC 103.

The high power supply voltage chip 111 is a semiconductor chip to which a VCC power supply is input. The 5V regulator is a circuit that adjusts a high voltage power supply of 15 V to a low voltage power supply of 5 V. The anomaly detector circuit 114 is a circuit that detects an anomaly in the IGBT 102, and detects, for example, an overcurrent. The transmitter circuit (TX) 115 is a circuit that transmits an anomaly signal output from the anomaly detector circuit 114. The transmitter circuit (TX) 115 is composed of the semiconductor device according to the first or second embodiment. The transformer 119 is a circuit that transmits a signal from the high power supply voltage chip 111 to the low power supply voltage chip 112. The transformer 119 transmits the signal by using an induced current, and therefore, the high power supply voltage chip 111 is not directly connected to the low power supply voltage chip 112.

The low power supply voltage chip 112 is a semiconductor chip that operates at a lower voltage than that of the high power supply voltage chip 111. The low power supply voltage chip 112 is connected to the microcomputer 104. The receiver circuit (RX) 116 in the low power supply voltage chip receives an anomaly detection signal from the transmitter circuit (TX) 115. Therefore, the microcomputer 104 can receive the anomaly signal.

Description of Semiconductor Device According to First Embodiment

Figure 2:
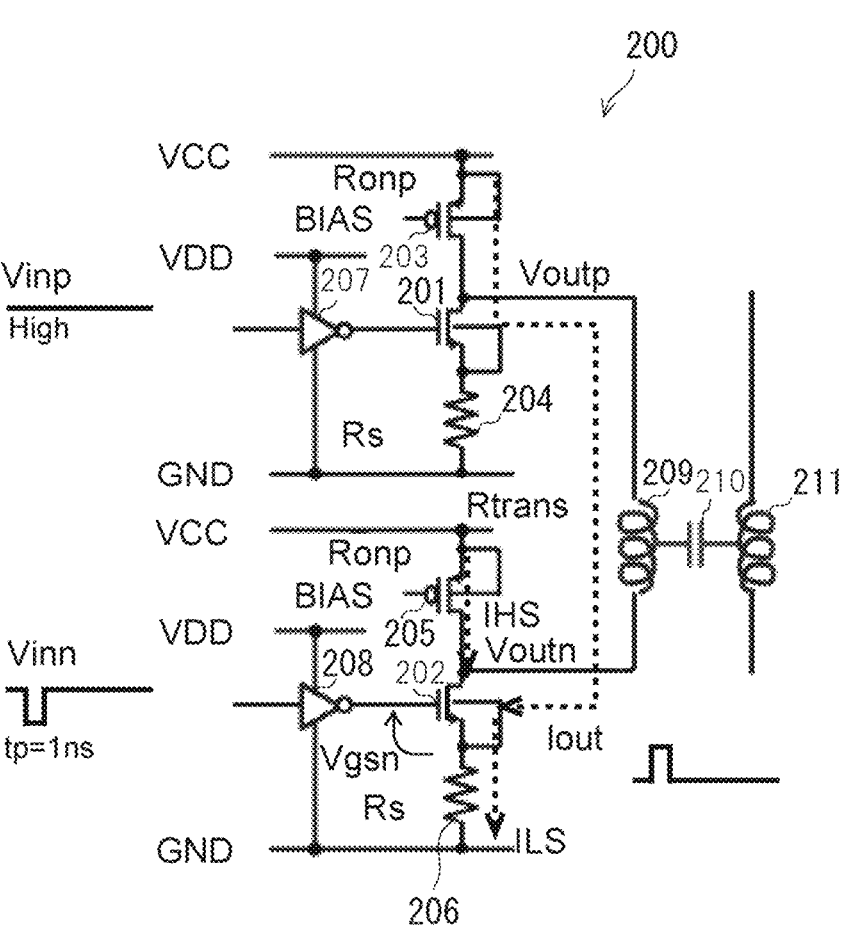
FIG. 2 is a circuit diagram of a semiconductor device according to a first embodiment.

FIG. 2 is a circuit diagram of the semiconductor device according to the first embodiment. The semiconductor device according to the first embodiment will be described with reference to FIG. 2.

A semiconductor device 200 according to the first embodiment includes a first N channel transistor 201 having its gate receiving a second voltage VDD as its input. The semiconductor device 200 includes a first resistance element 203 having its second terminal connected to a drain of the first N channel transistor. The semiconductor device 200 includes a second resistance element 204 having its first terminal connected to a source of the first N channel transistor 201. The semiconductor device 200 includes a second N channel transistor 202 having its gate receiving a second voltage as its input. The semiconductor device 200 includes a third resistance element 205 having its second terminal connected to a drain of the second N channel transistor 202. The semiconductor device 200 includes a fourth resistance element 206 having its first terminal connected to a source of the second N channel transistor 202. The semiconductor device 200 includes an isolator 209 having its first terminal connected to the drain of the first N channel transistor 201 and having its second terminal connected to the drain of the second N channel transistor 202.

The first resistance element 203 has its first terminal connected to a power supply line having a first voltage VCC. The second resistance element 204 has its second terminal connected to a power supply line having a third voltage GND (Ground). The third resistance element 205 has its first terminal connected to the power supply line having the first voltage. The fourth resistance element 206 has its second terminal connected to the power supply line having the third voltage.

An output stage of the semiconductor device 200 is composed of an H bridge, and receives the first voltage VCC supplied from an external power supply. Therefore, the first resistance element 203 preferably has an equal resistance value to that of the third resistance element 205, and the second resistance element 204 preferably has an equal resistance value to that of the fourth resistance element 206. The first N channel transistor 201 preferably has an equal current driving capability to that of the second N channel transistor 202.

The semiconductor device 200 is a two-polarity pulse generation circuit. Therefore, the first resistance element 203 is preferably composed of an on-resistance of a first P channel transistor 203, and the third resistance element 205 is preferably composed of an on-resistance of a second P channel transistor 205. The first P channel transistor 203 has its gate biased to be always turned on. Similarly, the second P channel transistor 205 has its gate biased to be always turned on.

The first voltage VCC is, for example, 15 V. The second voltage VDD is, for example, 5 V. The third voltage GND is, for example, a ground potential (0 V). Therefore, the first voltage is larger than the second voltage, and the second voltage is larger than the third voltage.

The semiconductor device 200 is a transmitter circuit for detecting an anomaly in a gate driver circuit, an anomaly detection signal is input to the gate of the second N channel transistor 202, and a current corresponding to the anomaly detection signal flows through the isolator 209. When the current flows through the isolator 209, the current flows to an isolator 211 on the receiving side via an insulation capacitance 210.

The isolator 209 is a part of the transformer 119, and transmits the anomaly detection signal to the microcomputer 104 via the receiver circuit (RX) 116 in the low power supply voltage chip 112 in an insulated state.

Method for Driving Semiconductor Device According to First Embodiment

A method for driving the semiconductor device according to the first embodiment will be described with reference to FIG. 2. When a low-potential pulse anomaly signal is detected, a second voltage signal is input to the gate of the second N channel transistor 202 via a second inverter 208. A third voltage signal is input to the gate of the first N channel transistor 201 via a first inverter 207. Then, the first N channel transistor 201 is turned off, and the second N channel transistor 202 is turned on. A current flows between a source and a drain of the first P channel transistor 203, and a current flows between a source and a drain of the second P channel transistor 205. In this case, the second voltage is assumed to be VDD, and a voltage between the gate and the source of the first N channel transistor 201 is assumed to be Vgsn. A resistance value of each of the second resistance element 204 and the fourth resistance element 206 is assumed to be Rs, and an on-resistance value of each of the first P channel transistor 203 and the second P channel transistor 205 is assumed to be Ronp. When a resistance value of the isolator 209 is assumed to be Rtrans, a current value ILS flowing through the fourth resistance element 206 is expressed by an equation 1.

$$ILS = \frac{VDD - Vgsn}{Rs} \qquad \text{[Equation 1]}$$

A current value Iout flowing through the isolator 209 is expressed by an equation 2.

$$Iout = \frac{VDD - Vgsn}{Rs}\left(\frac{Ronp}{2Ronp + Rtrans}\right) \qquad \text{[Equation 2]}$$

The semiconductor device 200 always turns on the first P channel transistor 203 and the second P channel transistor 205, and is driven by only the first N channel transistor 201 and the second N channel transistor 202. Accordingly, a low-speed circuit such as a level shifter that converts a low voltage signal into a high voltage signal is not used, and therefore, a pulse current can be driven at high speed.

The current value Iout hardly varies because it does not depend on the voltage VCC but depends on the voltage VDD adjusted and generated. The current value Iout can be increased by increasing the on-resistance value Ronp. In the case, the on-resistance value Ronp is set such that the first N channel transistor 201 and the second N channel transistor 202 can operate in a saturation region even if the voltage VCC drops.

For example, the semiconductor device according to the above-described embodiment may have a configuration in which a conductivity type (p-type or n-type conductivity type) of each of a semiconductor substrate, a semiconductor layer, a diffusion layer (diffusion region), or the like is inverted. Accordingly, when one of the n-type conductivity type and the p-type conductivity type is set as a first conductivity type while the other conductivity type is set as a second conductivity type, the first conductivity type and the second conductivity type can also be respectively set as a p-type conductivity type and an n-type conductivity type, or conversely the first conductivity type and the second conductivity type can also be respectively set as an n-type conductivity type and a p-type conductivity type.

Description of Semiconductor Device According to Second Embodiment

Figure 3:
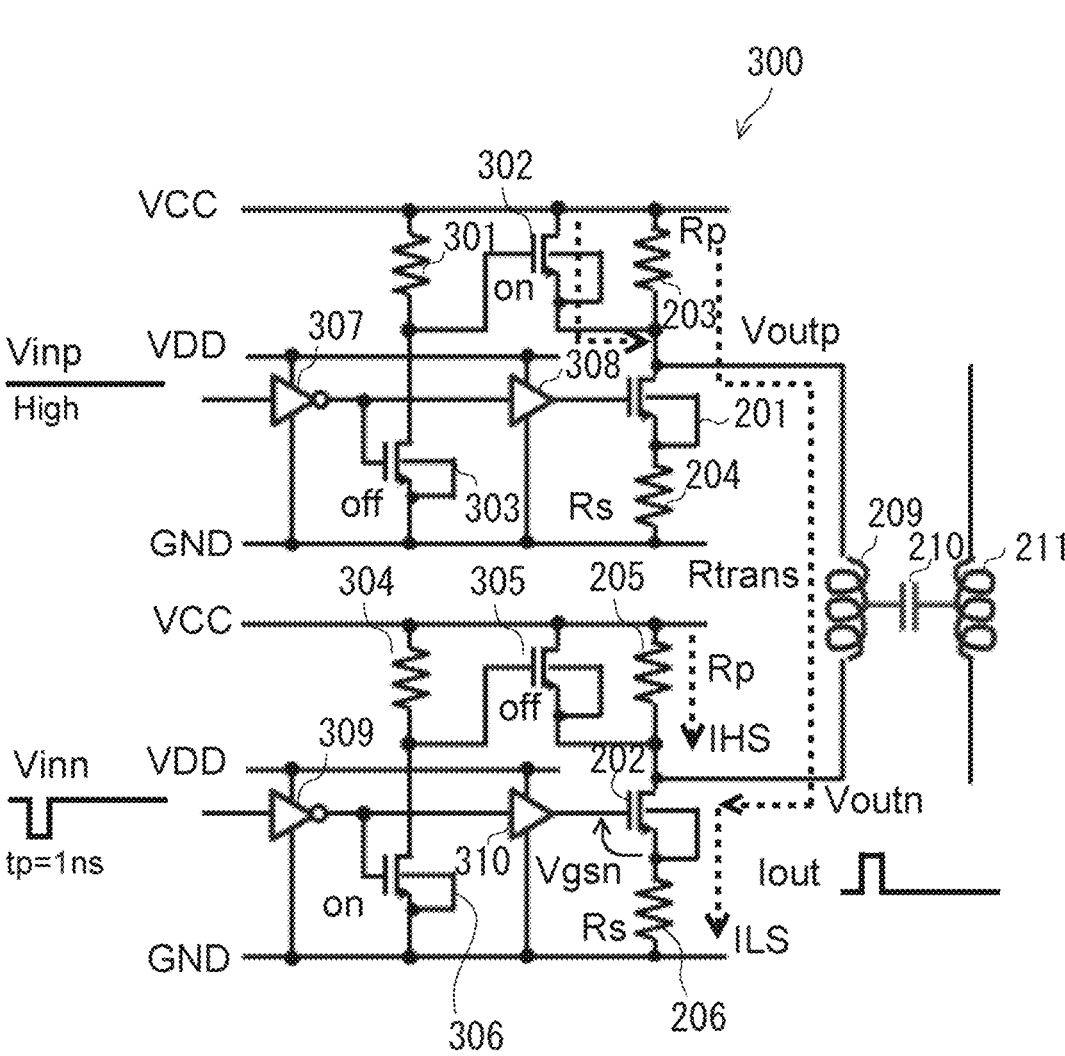
FIG. 3 is a circuit diagram of a semiconductor device according to a second embodiment.

FIG. 3 is a circuit diagram of the semiconductor device according to the second embodiment. The semiconductor device according to the second embodiment will be described with reference to FIG. 3.

A semiconductor device 300 according to the second embodiment differs from the semiconductor device according to the first embodiment in that an auxiliary third N channel transistor 302 is inserted in parallel with a first resistance element 203. The semiconductor device 300 according to the second embodiment differs from the semiconductor device according to the first embodiment in that an auxiliary fifth N channel transistor 305 is inserted in parallel with a third resistance element 205.

That is, as illustrated in FIG. 3, the semiconductor device 300 according to the second embodiment includes a fifth resistance element 301 having its first terminal connected to a power supply line having a first voltage. The semiconductor device 300 includes the third N channel transistor 302 having its drain connected to the power supply line having the first voltage, having its source connected to a second terminal of the first resistance element 203, and having its gate connected to a second terminal of the fifth resistance element 301. The semiconductor device 300 includes a fourth N channel transistor 303 having its drain connected to the second terminal of the fifth resistance element 301 and having its source connected to a power supply line having a third voltage. The fourth N channel transistor 303 has its gate receiving a signal having the same waveform as that of a signal to be input to a gate of a first N channel transistor 201.

As illustrated in FIG. 3, the semiconductor device 300 includes a sixth resistance element 304 having its first terminal connected to the power supply line having the first voltage. The semiconductor device 300 includes the fifth N channel transistor 305 having its drain connected to the power supply line having the first voltage, having its source connected to a second terminal of the third resistance element 205, and having its gate connected to a second terminal of the sixth resistance element 304. The semiconductor device 300 includes a sixth N channel transistor 306 having its drain connected to the second terminal of the sixth resistance element 304 and having its source connected to the power supply line having the third voltage. The sixth N channel transistor 306 has its gate receiving a signal having the same waveform as that of a signal to be input to a gate of a second N channel transistor 202.

Usually, a VCC voltage is applied to the gate of the auxiliary third N channel transistor 302. If a voltage between the gate and the source of the auxiliary third N channel transistor 302 is opened when the anomaly signal is detected, the auxiliary third N channel transistor 302 is turned on to supply a current, and therefore, a drop in an output voltage is reduced.

An upper stage circuit and a lower stage circuit of the semiconductor device 200 illustrated in FIG. 3 are mirror images of each other. Accordingly, the third N channel transistor 302 preferably has an equal current driving capability to that of the fifth N channel transistor 305. The fourth N channel transistor 303 preferably has an equal current driving capability to that of the sixth N channel transistor 306.

Method for Driving Semiconductor Device According to Second Embodiment

A method for driving the semiconductor device according to the second embodiment will be described with reference to FIG. 3. When a low-potential pulse anomaly signal is detected, a second voltage signal is input to the gate of the second N channel transistor 202 via a fourth inverter 309 and a second buffer 310. A third voltage signal is input to the gate of the first N channel transistor 201 via a third inverter 307 and a first buffer 308. At that time, the second voltage signal is input to the gate of the sixth N channel transistor 306 via the fourth inverter 309. The third voltage signal is input to the gate of the fourth N channel transistor 303 via the third inverter 307. Then, the first N channel transistor 201 is turned off. The second N channel transistor 202 is turned on. The third N channel transistor 302 is turned on. The fourth N channel transistor 303 is turned off. The fifth N channel transistor 305 is turned off. The sixth N channel transistor 306 is turned on. Thus, the semiconductor device 300 is driven such that a current flows through an isolator 209.

A second voltage is assumed to be VDD, and a voltage between the gate and a source of the first N channel transistor 201 is assumed to be Vgsn. A resistance value of each of a second resistance element 204 and a fourth resistance element 206 is assumed to be Rs, and a resistance value of each of the first resistance element 203 and the third resistance element 205 is assumed to be Rp. An on-resistance value of the third N channel transistor 302 is assumed to be Ronn, and a resistance value of the isolator 209 is assumed to be Rtrans. A current value Iout flowing through the isolator 209 is expressed by an equation 3.

$$Iout = \frac{VDD - Vgsn}{Rs}\left(\frac{Rp}{Rp + \dfrac{RpRonn}{Rp + Ronn} + Rtrans}\right) \qquad \text{[Equation 3]}$$

According to the above-described configuration, the current value Iout can be increased by increasing the resistance value Rp of each of the first resistance element and the third resistance element as similar to the first embodiment. However, the auxiliary third N channel transistor 302 is turned on in parallel, and therefore, the configuration has an effect that prevents increase in a voltage drop even in increase in the resistance value Rp. Accordingly, the first resistance element and the third resistance element are designed to be larger while the third N channel transistor 302 is designed to be smaller than those in the first embodiment, and therefore, the driving capability is improved with reduction of the area of the entire semiconductor device 300.

In the foregoing, the invention made by the inventors of the present invention has been concretely described on the basis of the embodiments. However, it is needless to say that the present invention is not limited to the foregoing embodiments, and various modifications can be made within the scope of the present invention.

What is claimed is:

1. A semiconductor device comprising:
a first N channel transistor having a gate receiving a second voltage as an input of the first N channel transistor;
a first resistance element having a second terminal connected to a drain of the first N channel transistor;
a second resistance element having a first terminal connected to a source of the first N channel transistor;
a second N channel transistor having a gate receiving the second voltage as an input of the second N channel transistor;
a third resistance element having a second terminal connected to a drain of the second N channel transistor;
a fourth resistance element having a first terminal connected to a source of the second N channel transistor; and
an isolator having a first terminal connected to the drain of the first N channel transistor and having a second terminal connected to the drain of the second N channel transistor,
wherein the first resistance element has a first terminal connected to a power supply line having a first voltage,
wherein the second resistance element has a second terminal connected to a power supply line having a third voltage,
wherein the third resistance element has a first terminal connected to the power supply line having the first voltage,
wherein the fourth resistance element has a second terminal connected to the power supply line having the third voltage, and
wherein the semiconductor device further comprises:
a fifth resistance element having a first terminal connected to the power supply line having the first voltage;

a third N channel transistor having a drain connected to the power supply line having the first voltage, having a source connected to the second terminal of the first resistance element, and having a gate connected to a second terminal of the fifth resistance element;
a fourth N channel transistor having a drain connected to the second terminal of the fifth resistance element, having a source connected to the power supply line having the third voltage, and having a gate receiving a signal having a same waveform as that of a signal to be input to the gate of the first N channel transistor;
a sixth resistance element having a first terminal connected to the power supply line having the first voltage;
a fifth N channel transistor having a drain connected to the power supply line having the first voltage, having a source connected to the second terminal of the third resistance element, and having a gate connected to a second terminal of the sixth resistance element; and
a sixth N channel transistor having a drain connected to the second terminal of the sixth resistance element, having a source connected to the power supply line having the third voltage, and having a gate receiving a signal having a same waveform as that of a signal to be input to the gate of the second N channel transistor.

2. The semiconductor device according to claim 1, wherein the first resistance element has an equal resistance value to that of the third resistance element.

3. The semiconductor device according to claim 2, wherein the first resistance element is composed of an on-resistance of a first P channel transistor, and wherein the third resistance element is composed of an on-resistance of a second P channel transistor.

4. The semiconductor device according to claim 1, wherein the first N channel transistor has an equal current driving capability to that of the second N channel transistor.

5. The semiconductor device according to claim 1, wherein the second resistance element has an equal resistance value to that of the fourth resistance element.

6. The semiconductor device according to claim 1, wherein the third N channel transistor has an equal current driving capability to that of the fifth N channel transistor, and wherein the fourth N channel transistor has an equal current driving capability to that of the sixth N channel transistor.

7. The semiconductor device according to claim 1, wherein the first voltage is larger than the second voltage, and the second voltage is larger than the third voltage.

8. The semiconductor device according to claim 7, wherein the second voltage is generated by adjusting the first voltage.

9. The semiconductor device according to claim 8, wherein the first voltage is 15 V, the second voltage is 5 V, and the third voltage is a ground.

10. The semiconductor device according to claim 1, wherein the semiconductor device is a transmitter circuit for detecting an anomaly in a gate driver circuit, wherein an anomaly detection signal is input to the gate of the second N channel transistor, and wherein a current corresponding to the anomaly detection signal flows through the isolator.

11. The semiconductor device according to claim 10, wherein the isolator is a part of a transformer, and transmits the anomaly detection signal to a computer via a receiver circuit of a low power supply voltage chip in an insulated state.

12. A method for driving the semiconductor device according to claim 1, wherein when the third voltage is input to the gate of the first N channel transistor, when the second voltage is input to the gate of the second N channel transistor, when the third voltage is input to the gate of the fourth N channel transistor, when the second voltage is input to the gate of the sixth N channel transistor, when the first N channel transistor is turned off, when the second N channel transistor is turned on, when the third N channel transistor is turned on, when the fourth N channel transistor is turned off, when the fifth N channel transistor is turned off, and when the sixth N channel transistor is turned on, a current value Iout flowing through the isolator is expressed by an equation 1, $$Iout = \frac{VDD - Vgsn}{Rs} \left( \frac{Rp}{Rp + \dfrac{RpRonn}{Rp + Ronn} + Rtrans} \right) \qquad \text{[Equation 1]}$$

where the second voltage is VDD, a voltage between the gate and the source of the first N channel transistor is Vgsn, a resistance value of each of the second resistance element and the fourth resistance element is Rs, a resistance value of each of the first resistance element and the third resistance element is Rp, and an on-resistance value of the third N channel transistor is Ronn, and a resistance value of the isolator is Rtrans.

* * * * *